US008400382B2

(12) United States Patent
Meno

(10) Patent No.: US 8,400,382 B2
(45) Date of Patent: Mar. 19, 2013

(54) D/A CONVERTER CIRCUIT, LIQUID CRYSTAL DRIVING CIRCUIT, AND LIQUID CRYSTAL DEVICE

(75) Inventor: Fumio Meno, Ohita (JP)

(73) Assignee: Sony Corporation, Tokyo (JP)

( * ) Notice: Subject to any disclaimer, the term of this patent is extended or adjusted under 35 U.S.C. 154(b) by 773 days.

(21) Appl. No.: 11/768,504

(22) Filed: Jun. 26, 2007

(65) Prior Publication Data

US 2008/0012843 A1 Jan. 17, 2008

(30) Foreign Application Priority Data

Jun. 30, 2006 (JP) ................................ 2006-182811

(51) Int. Cl.
*G09G 3/36* (2006.01)
*H03M 1/66* (2006.01)

(52) U.S. Cl. ............. 345/87; 345/94; 341/144; 341/150

(58) Field of Classification Search ........................ None
See application file for complete search history.

(56) References Cited

U.S. PATENT DOCUMENTS 3,651,518 A * 3/1972 Carbrey ........................ 341/172
3,836,906 A * 9/1974 Ando et al. ................... 341/136
4,186,383 A * 1/1980 Hofflinger et al. ............ 341/150
4,431,987 A * 2/1984 Whiteside ..................... 341/118
4,616,212 A * 10/1986 Law et al. ..................... 341/145
4,743,885 A * 5/1988 Kobayashi et al. ........... 341/118
5,400,028 A * 3/1995 Schlig ........................... 341/150
6,169,508 B1 * 1/2001 Edwards ....................... 341/150
6,917,321 B1 * 7/2005 Haurie et al. ................. 341/144
6,924,760 B1 * 8/2005 McLeod et al. ............... 341/144
RE38,918 E * 12/2005 Svensson et al. ............... 363/60
7,345,615 B2 * 3/2008 Kawahito ...................... 341/162
7,423,558 B2 * 9/2008 Ueno ............................. 341/50
2003/0098708 A1 * 5/2003 Matsueda ..................... 324/770
2009/0040089 A1 * 2/2009 Dosho et al. .................. 341/161

FOREIGN PATENT DOCUMENTS

JP 2001-094426 4/2001

* cited by examiner

*Primary Examiner* — Bipin Shalwala
*Assistant Examiner* — Keith Crawley
(74) *Attorney, Agent, or Firm* — SNR Denton US LLP

(57) ABSTRACT

A digital-to-analog converter circuit is configured to convert an m-bit digital signal into an analog signal. The circuit includes a bit voltage generator convert each bit of segmented n-bit units of the digital signal into a first voltage or a second voltage, first capacitors each configured to store the voltage for each bit output from the bit voltage generator, switches connected to the first capacitors, a second capacitor connected to the switches, an output unit configured to output the voltage stored in the second capacitor as an analog signal, and a control unit configured to control the switches, connect in parallel the first capacitors with the second capacitor, and adjust the voltage stored in the second capacitor.

3 Claims, 16 Drawing Sheets

Related Art FIG. 13
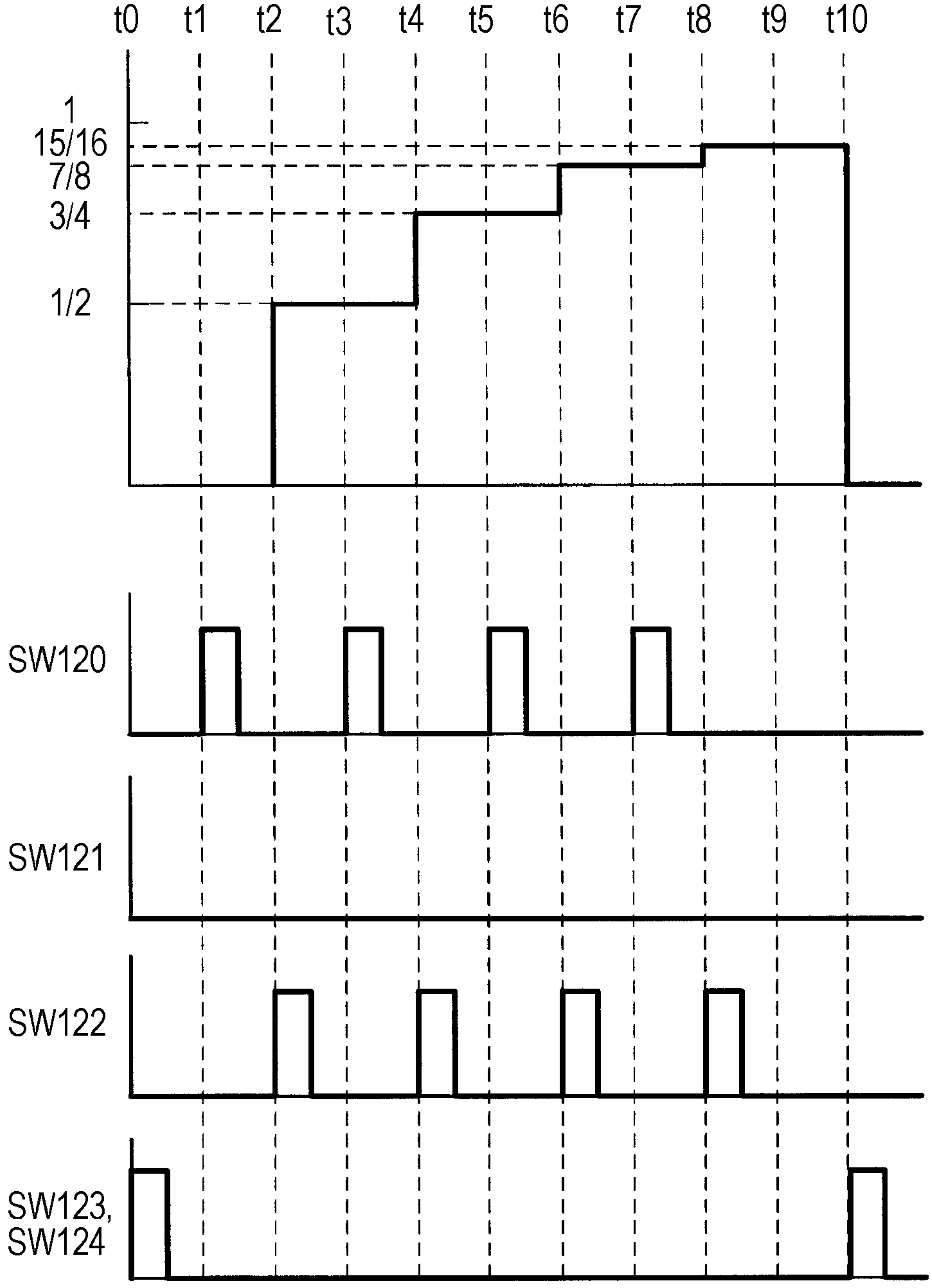

Related Art FIG. 14
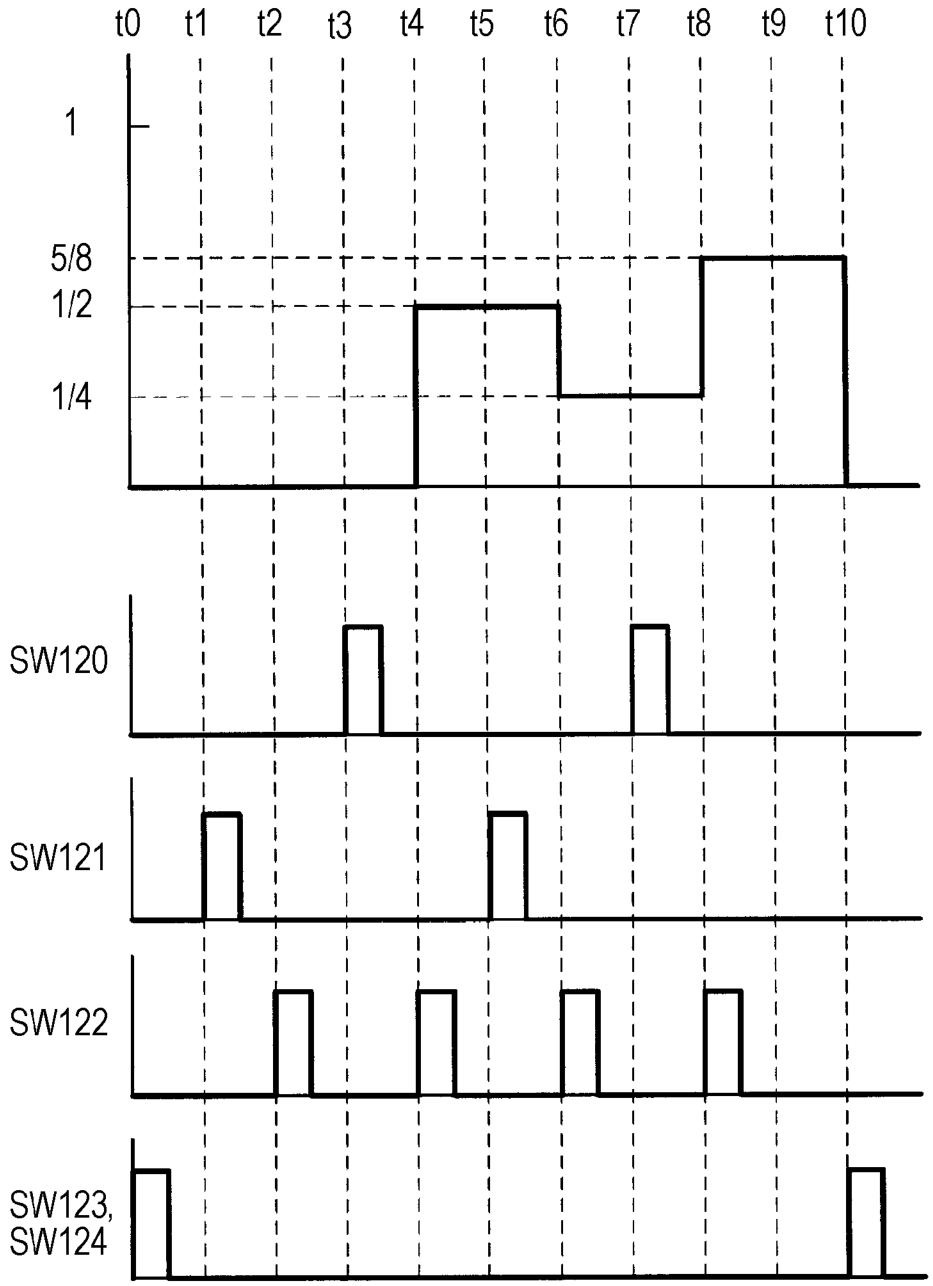

Related Art FIG. 15
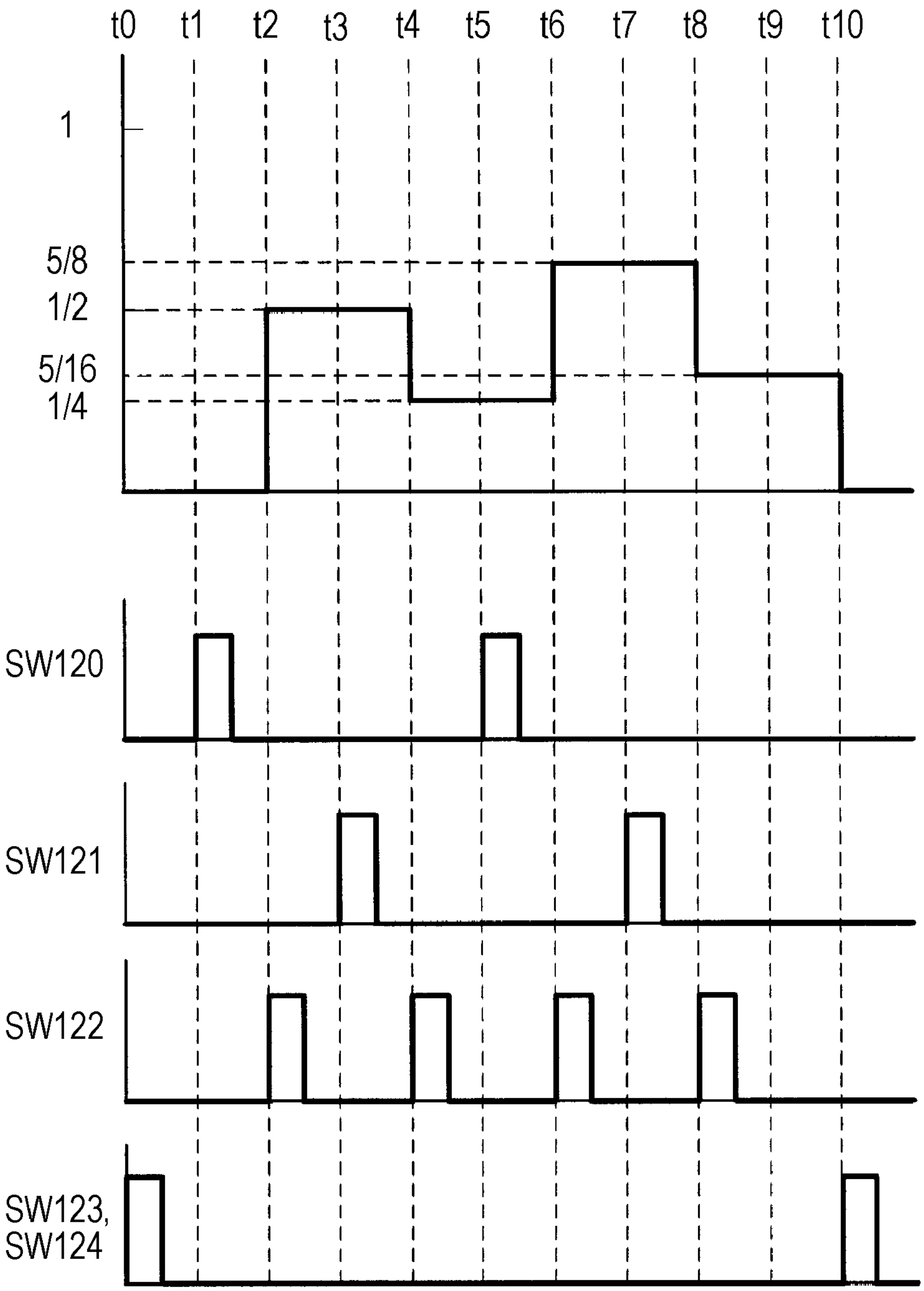

Related Art FIG. 16
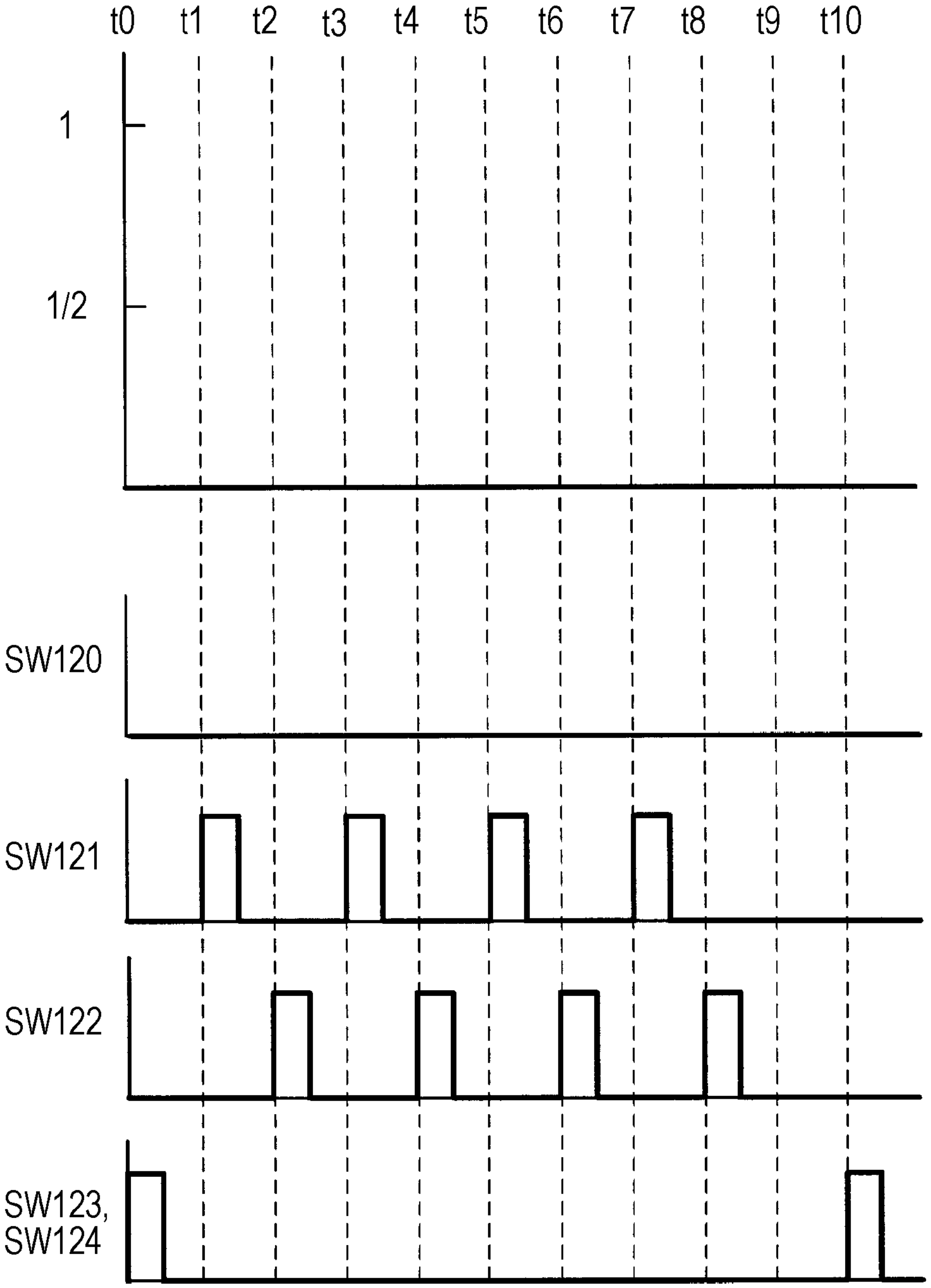

D/A CONVERTER CIRCUIT, LIQUID CRYSTAL DRIVING CIRCUIT, AND LIQUID CRYSTAL DEVICE

CROSS REFERENCES TO RELATED APPLICATIONS

The present invention contains subject matter related to Japanese Patent Application JP 2006-182811 filed in the Japanese Patent Office on Jun. 30, 2006, the entire contents of which are incorporated herein by reference.

BACKGROUND OF THE INVENTION

1. Field of the Invention

The present invention relates to a digital-to-analog (D/A) converter circuit, a liquid crystal driving circuit, and a liquid crystal display apparatus.

2. Description of the Related Art

Nowadays, liquid crystal devices (LCDs) are in wide use as displays. Since such LCDs are thin, light, and low power consumption, they are often used for mobile terminals, such as mobile phones, personal digital assistances (PDAs), notebook computers, and portable televisions.

Large liquid crystal devices have been developed and have been applied to large-screen stationary displays and large screen televisions.

Such a liquid crystal device includes a liquid crystal panel and a liquid-crystal-panel driving circuit that drives the liquid crystal panel. The liquid-crystal-panel driving circuit converts a digital signal input as an image signal into an analog signal at an internal D/A converter circuit and inputs the analog signal to the liquid crystal panel so as to display an image on the liquid crystal panel.

As described above, the liquid-crystal-panel driving circuit includes a D/A converter circuit that converts a digital signal into an analog signal. For such a D/A converter circuit, in the past, a resistive ladder type has mainly been used.

As shown in FIG. 10, with a resistive ladder type D/A converter circuit, a plurality of resistors R101 are connected in serial between reference voltages (between VRT-0 V). Then, a decoder 102 controls a switching unit 101 so as to select a first voltage corresponding to a digital signal among the tap voltage between the resistors R101 and output an analog signal Vout corresponding to the input digital signal.

In this way, a resistive ladder type D/A converter circuit includes a number of resistors equaling the gradation level between the reference voltage. Each resistor is connected to a switching circuit so that a desired resistor tap can be selected. A resistive ladder type D/A converter circuit has been put to wide use because the structure is simple and easy to construct and because it exhibits good performance.

However, recently, along with the increase in image quality of liquid crystal devices, 10 bit or higher gradation level is required for a D/A converter circuit. Therefore, known resistive ladder type D/A converter circuit have been facing their limits.

In other words, with a resistive ladder type D/A converter circuit, since the numbers of resistors R101 and switches SW101 double as the number of bits increase, the mounting area (chip size) also doubles. Usually, about 8 bits is a realistic limit to a resistive ladder type D/A converter circuit due to limitations on the mounting area. Thus, the limit on the relative accuracy of resistors that can be mounted on a semiconductor is set.

Accordingly, recently, attention has been given to a serial cyclic D/A converter circuit whose mounting area does not increase even when the gradation level is increased (for example, refer to Japanese Unexamined Patent Application Publication No. 2001-94426).

Now, the principle of a known cyclic D/A converter circuit will be described with reference to the drawings. FIG. 11 illustrates the principle of a known cyclic D/A converter circuit.

As shown in FIG. 11, a cyclic D/A converter circuit 110 includes a parallel-to-serial converter circuit 111 that converts parallel digital data, which is a digital signal, into serial digital data, a switching unit 112 that outputs a voltage corresponding to each bit of serial digital data output from the parallel-to-serial converter circuit 111, an multiplying unit 113 that multiplies the voltage output from the switching unit 112 and the voltage output from a voltage converter circuit 115, described below, a sample hold (S/H) circuit 114 that holds the voltage output from the multiply unit 113, and the voltage converter circuit 115 that reduces the voltage output from the S/H circuit 114 by half.

The parallel digital data input to the cyclic D/A converter circuit 110 is converted into serial digital data by the parallel-to-serial converter circuit 111 and is output in sequence to the switching unit 112.

The switching unit 112 output in sequence a voltage (a first voltage VRT or a second voltage (zero volts in this case)) corresponding to data of each bit of the serial digital data. For example, when the digital data is "1," a switch SW101 is short-circuited so as to output the first voltage VRT, whereas when the digital data is "0," a switch SW102 is short-circuited so as to output the second voltage (zero volts).

The multiplying unit 113 adds the output voltage from the voltage converter circuit 115 to the voltage output in sequence from the switching unit 112, and then outputs the result to the S/H circuit 114.

Then, half of the voltage output from the S/H circuit 114 is output from the voltage converter circuit 115. This voltage is the output voltage Vout from the cyclic D/A converter circuit 110.

In this way, every time a voltage corresponding to bit data is output from the switching unit 112, the cyclic D/A converter circuit 110 adds to this voltage half the voltage held in the S/H circuit 114. By holding the result at the S/H circuit 114 and reducing the voltage by half, the output voltage Vout is generated, and a digital signal is converted into an analog signal.

Next, an example of a detailed structure of a cyclic D/A converter circuit employing the above-described principle will be described with reference to FIG. 12. FIG. 12 illustrates a detailed structure of a cyclic D/A converter circuit.

As shown in FIG. 12, a D/A converter circuit 120 includes a parallel-serial converter circuit 121 that converts parallel digital data into serial digital data, switches SW120 and SW121 that select either a first voltage VRT or a second voltage (zero volts in this case) for each bit of digital data depending on the serial digital data output from the parallel-serial converter circuit 121, a first capacitor C120 that receives the first voltage or the second voltage applied by short-circuiting the switch SW120 or SW121, a switch SW122 that connects the first capacitor C120 and a second capacitor C121 in parallel, described below, the second capacitor C121, switches SW123 and SW124, and a voltage follower AMP120. The first capacitor C120 and the second capacitor C121 have the same capacitance Ca(F).

With the D/A converter circuit 120 configured as described above, for example, when the digital signals $D_{m-1}$, $D_{m-2}$, . . . $D_1$, and $D_0$ input to the D/A converter circuit 120 correspond to "1111," the switches SW120 to SW124 and the second capacitor C121 enter states as illustrated in FIG. 13.

First, at a timing t0, the switches SW123 and SW124 short-circuit, the electric charge stored in the first capacitor C120 and the second capacitor C121 are discharged, and the voltages of the capacitors are set to zero volts.

Next, at a timing t1, to apply a voltage corresponding to the data "1" of the least significant bit $D_0$ output from the parallel-serial converter circuit 121 to the first capacitor C120, the switch SW120 is short-circuited for a predetermined amount of time. In other words, the voltage of the first capacitor C120 is set to the first voltage VRT, and an electric charge Ca×VRT is stored in the first capacitor C120.

Then, at a timing t2, the switch SW122 is short-circuited for a predetermined amount of time, and the first capacitor C120 and the second capacitor C121 are connected in parallel. Part of the electric charge stored in the first capacitor C120 is discharged to the second capacitor C121 so as to set the first capacitor C120 and the second capacitor C121 to equal voltage levels.

Since the first capacitor C120 and the second capacitor C121 have the same capacitance Ca, when the switch SW122 is short-circuited, an electric charge CaXVRT/2 is applied from the first capacitor C120 to the second capacitor C121. The voltage levels of the first and second capacitors C120 and C121 are VRT/2.

Next, to apply a voltage signal corresponding to data "1" of a second least significant bit $D_1$ output from the parallel-serial converter circuit 121 to the first capacitor C120 at a timing t3, the switch SW120 is short-circuited for a predetermined amount of time. In other words, the voltage of the first capacitor C120 is set to the first voltage VRT.

Then, at a timing t4, the switch SW122 is short-circuited for a predetermined amount of time, and the first capacitor C120 and the second capacitor C121 are connected in parallel so as to set the first capacitor C120 and the second capacitor C121 to equal voltage levels.

Since the first capacitor C120 and the second capacitor C121 have the same capacitance Ca, when the switch SW122 is short-circuited, an electric charge Ca×VRT/4 is applied from the first capacitor C120 to the second capacitor C121. The voltage levels of the first and second capacitors C120 and C121 are VRT×¾.

Next, to apply a voltage signal corresponding to data "1" of a third least significant bit $D_2$ output from the parallel-serial converter circuit 121 to the first capacitor C120 at a timing t5, the switch SW120 is short-circuited for a predetermined amount of time. In other words, the voltage of the first capacitor C120 is set to the first voltage VRT.

Then, at a timing t6, the switch SW122 is short-circuited for a predetermined amount of time, and the first capacitor C120 and the second capacitor C121 are connected in parallel so as to set the first capacitor C120 and the second capacitor C121 to equal voltage levels.

Since the first capacitor C120 and the second capacitor C121 have the same capacitance Ca, when the switch SW122 is short-circuited, an electric charge Ca×VRT/8 is applied from the first capacitor C120 to the second capacitor C121. The voltage levels of the first and second capacitors C120 and C121 are VRT×⅞.

Next, to apply a voltage signal corresponding to data "1" of a most significant bit $D_3$ output from the parallel-serial converter circuit 121 to the first capacitor C120 at a timing t7, the switch SW120 is short-circuited for a predetermined amount of time. In other words, the voltage of the first capacitor C120 is set to the first voltage VRT.

Then, at a timing t8, the switch SW122 is short-circuited for a predetermined amount of time, and the first capacitor C120 and the second capacitor C121 are connected in parallel so as to set the first capacitor C120 and the second capacitor C121 to equal voltage levels.

Since the first capacitor C120 and the second capacitor C121 have the same capacitance Ca, when the switch SW122 is short-circuited, an electric charge Ca×VRT/16 is applied from the first capacitor C120 to the second capacitor C121. The voltage levels of the first and second capacitors C120 and C121 are VRT×15/16.

As shown in FIG. 14, when "1010" is input as digital signals $D_3D_2D_1D_0$, the voltage level of the output voltage Vout is maintained at zero volts by the least significant bit $D_0$ output from the parallel-serial converter circuit 121. Then, the voltage level is set to VRT×½ by the subsequent second bit $D_1$, then set to VRT×¼ by the subsequent third bit $D_2$, and then set to VRT×⅝ by the most significant bit $D_3$.

As shown in FIG. 15, when "0101" is input as digital signals $D_3D_2D_1D_0$, the voltage level of the output voltage Vout is set to VRT×½ by the least significant bit $D_0$ output from the parallel-serial converter circuit 121. Then, the voltage level is set to VRT×¼ by the subsequent second bit $D_1$, then set to VRT×⅝ by the subsequent third bit $D_2$, and then set to VRT×5/16 by the most significant bit $D_3$.

As shown in FIG. 16, when "0000" is input as digital signals $D_3D_2D_1D_0$, the voltage level of the output voltage Vout is not increased and is maintained at zero volts by the least significant bit $D_0$, the second bit $D_1$, the third bit, $D_2$, and the most significant bit $D_3$ output from the parallel-serial converter circuit 121.

In this way, a serial cyclic D/A converter circuit is advantageous in that the circuit size is basically not increased even when the number of bits input as digital data is increased.

SUMMARY OF THE INVENTION

However, when the above-described cyclic D/A converter circuit is used as a high-gradation-level D/A converter circuit, as the number of bits of the digital signal to be converted increases, the number of time discharging and charging is repeated increases. As a result, the speed of the D/A converter circuit is prevented from being increased.

In other words, the mounting area of a cyclic D/A converter circuit can be reduced compared with a resistive ladder type D/A converter circuit. However, when the above-described cyclic D/A converter circuit is used as a high-gradation-level D/A converter circuit, high-speed operation cannot be carried out.

The present invention has been conceived in light of the problem described above and provides a D/A converter circuit that suppress an increase in the mounting area and that can carry out high-speed operation.

A digital-to-analog converter circuit according to an embodiment of the present invention is configured to convert an m-bit digital signal into an analog signal and includes a bit voltage generator configured to segment the digital signal into n-bit ($n \leqq m/2$) units from a least significant bit to a most significant bit and convert each bit of the segmented n-bit units of the digital signal into a first voltage or a second voltage, an n number of first capacitors each configured to store the voltage for each bit output from the bit voltage generator, an n number of switches whose first ends are connected to the n number of first capacitors; a second capacitor connected to second ends of the n number of switches, an output unit configured to output the voltage stored in the second capacitor as an analog signal, and a control unit configured to control the n number of switches, to connect in parallel the n number of first capacitors with the second capacitor, and to adjust the voltage stored in the second capacitor, wherein capacitance value of the first capacitor corresponding to a qth bit of each unit (where q is an integer equal to 1 or greater but not greater than n) is set to a value obtained by multiplying the capacitance of the first capacitor corresponding to the least significant bit with $2^{q-1}$.

A liquid crystal driving circuit according to an embodiment of the present invention is configured to output a driving signal for driving pixels provided on a liquid crystal display panel and includes a digital-to-analog converter circuit configured to convert an m-bit digital signal into an analog signal. The digital-to-analog converter circuit includes a bit voltage generator configured to segment the digital signal into n-bit ($n \leqq m/2$) units from a least significant bit to a most significant bit and convert each bit of the segmented n-bit units of the digital signal into a first voltage or a second voltage, an n number of first capacitors each configured to store the voltage for each bit output from the bit voltage generator, an n number of switches whose first ends are connected to the n number of first capacitors, a second capacitor connected to second ends of the n number of switches, an output unit configured to output the voltage stored in the second capacitor as an analog signal, and a control unit configured to control the n number of switches, connect in parallel the n number of first capacitors with the second capacitor, and adjust the voltage stored in the second capacitor, wherein capacitance value of the first capacitor corresponding to a qth bit of each unit (where q is an integer equal to 1 or greater but not greater than n) is set to a value obtained by multiplying the capacitance of the first capacitor corresponding to the least significant bit with $2^{q-1}$.

A liquid crystal device according to an embodiment of the present invention includes a liquid crystal display panel and a liquid crystal driving circuit configured to output a driving signal for driving pixels provided on a liquid crystal display panel. The liquid crystal driving circuit includes a plurality of digital-to-analog converter circuits, each of the digital-to-analog converter circuits being configured to convert an m-bit digital signal into an analog signal. Each of the digital-to-analog converter circuits includes a bit voltage generator configured to segment the digital signal into n-bit ($n \leqq m/2$) units from a least significant bit to a most significant bit and convert each bit of the segmented n-bit units of the digital signal into a first voltage or a second voltage, an n number of first capacitors each configured to store the voltage for each bit output from the bit voltage generator, an n number of switches whose first ends are connected to the n number of first capacitors, a second capacitor connected to second ends of the n number of switches, an output unit configured to output the voltage stored in the second capacitor as an analog signal, and a control unit configured to control the n number of switches, connect in parallel the n number of first capacitors with the second capacitor, and adjust the voltage stored in the second capacitor, wherein capacitance value of the first capacitor corresponding to a qth bit of each unit (where q is an integer equal to 1 or greater but not greater than n) is set to a value obtained by multiplying the capacitance of the first capacitor corresponding to the least significant bit with $2^{q-1}$.

According to an embodiment of the present invention, m sets of digital data is segmented into n units and is converted into analog signals by carrying out switching operations for m/n times. Therefore, an increase in the mounting area can be suppressed, and high-speed operation can be carried out. In particular, by adjusting the number n, digital-to-analog conversion can be carried out while balancing high-speed operation and the mounting area.

BRIEF DESCRIPTION OF THE DRAWINGS

FIG. 13 illustrates the operation of the cyclic D/A converter circuit shown in FIG. 12;

FIG. 14 illustrates the operation of the cyclic D/A converter circuit shown in FIG. 12;

FIG. 15 illustrates the operation of the cyclic D/A converter circuit shown in FIG. 12; and FIG. 16 illustrates the operation of the cyclic D/A converter circuit shown in FIG. 12;

DESCRIPTION OF THE PREFERRED EMBODIMENTS

Now, the structure and operation of a liquid crystal device 1 according to an embodiment of the present invention will be described below.

Figure 1:
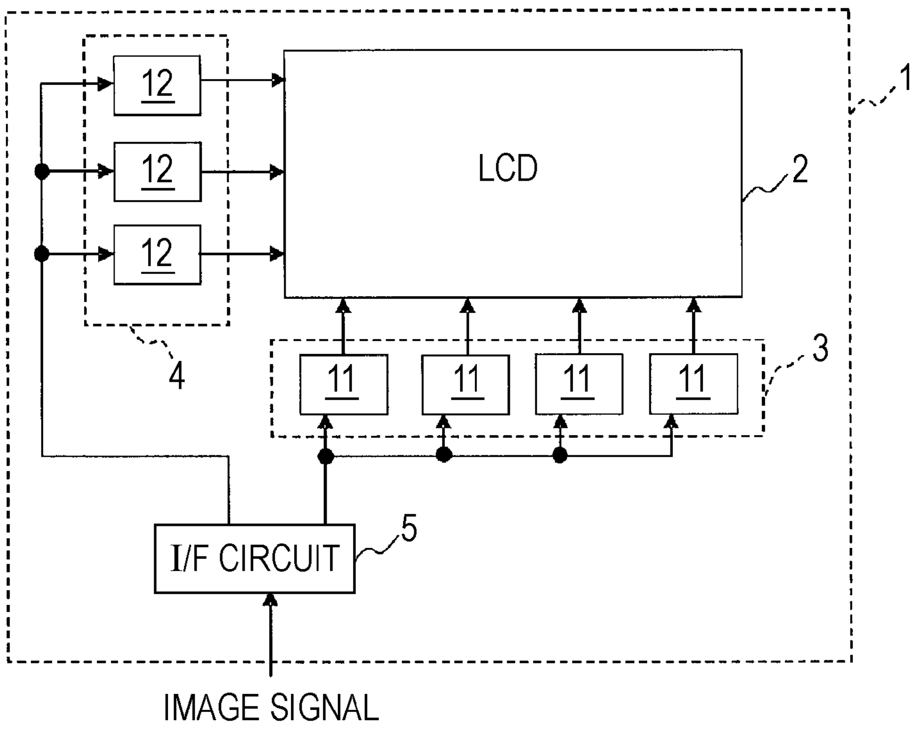
FIG. 1 is a schematic view of a liquid crystal device according to an embodiment of the present invention.

First, the structure of the liquid crystal device 1 will be described with reference to FIG. 1. FIG. 1 is a schematic block diagram of the liquid crystal device 1.

As shown in FIG. 1, the liquid crystal device 1 includes a liquid crystal panel 2, a horizontal driving circuit 3 having a plurality of source driver circuits 11 (equivalent to a liquid crystal driving circuit), a vertical driving circuit 4 having a plurality of gate driver circuits 12, and an interface circuit 5.

The liquid crystal panel 2 includes a semiconductor substrate having transparent pixel electrodes and TFTs, an opposing substrate having a transparent electrode covering the entire display unit, liquid crystal sealed between the substrates. By controlling each TFT having a switching function, a voltage corresponding to the pixel gradation is applied to each pixel electrode. In this way, a potential difference is generated between the pixel electrodes and the electrode of the opposing substrate so as to display an image by changing the transmittance of the liquid crystal.

The pixel electrodes are disposed on the liquid crystal panel 2 in the vertical and horizontal directions so as to form a matrix. On the semiconductor substrate of the liquid crystal panel 2, a plurality of data lines that are connected to the pixel electrodes aligned in the vertical direction and that apply gradation voltages to the pixel electrodes and scanning lines that apply control signals for switching the TFTs are provided.

Gradation voltages are applied to the pixel electrodes via the data lines and are controls by driving signals output from the source driver circuits 11. In other words, by the driving signals, gradation voltages are applied, during one frame of an image displayed, to all pixel electrodes connected to the data lines, and the pixel electrodes are driven so as to display an image on the liquid crystal panel 2.

The source driver circuits 11 outputs driving signals to the data lines by switching among the horizontal lines in sequence on the basis of a signal output from the interface circuit 5.

Figure 2:
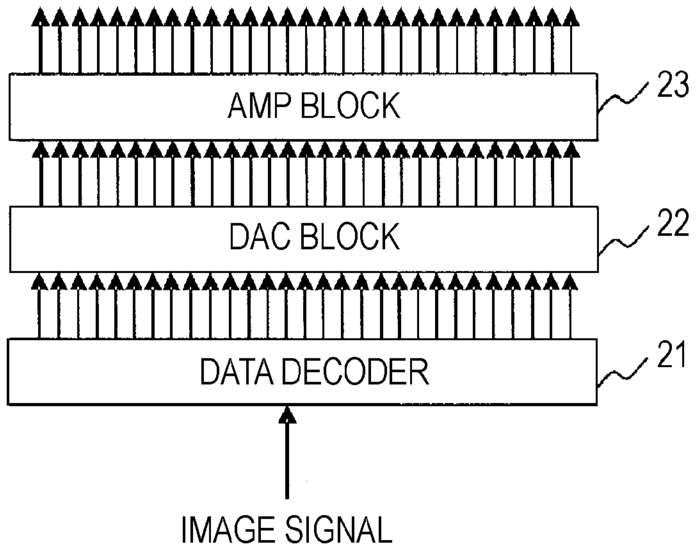
FIG. 2 is a schematic view of a source driver circuit shown in FIG. 1.

As shown in FIG. 2, the source driver circuits 11 includes a decoder circuit 21 that decodes the serial image signals supplied from the interface circuit 5 and outputs a driving digital signal for each vertical line of the liquid crystal panel 2, a D/A converter circuit block (digital-to-analog converter circuit block) 22 that converts the driving digital signals to driving analog signals, and an amplifier circuit block (AMP block) 23 that electrically amplifies the driving analog signal for the vertical lines output from the D/A converter circuit block 22 and outputs the amplified signals to the liquid crystal panel 2.

Each of the gate driver circuits 12 outputs, in sequence, control signals for switching the TFT for each horizontal line. In this way, an image is displayed on the liquid crystal panel 2 on the basis of driving signals output from the source driver circuits 11 while the horizontal lines are turned on one by one.

The interface circuit 5 receives image signals (for example, vertical start signals, vertical clocks, enable signals, vertical start signals, horizontal clocks, serial image data R, G, and B, and reference voltages) supplied from an external unit. The interface circuit 5 supplies timing pulsed signals for horizontal drive processing, such as serial image data signal, horizontal start signals, horizontal clocks, and output enable signals, to the source driver circuits 11 and supplies timing pulsed signals for vertical driving processing, such as enable signals, vertical clocks, vertical start signals, to the gate driver circuits 12.

Figure 3:
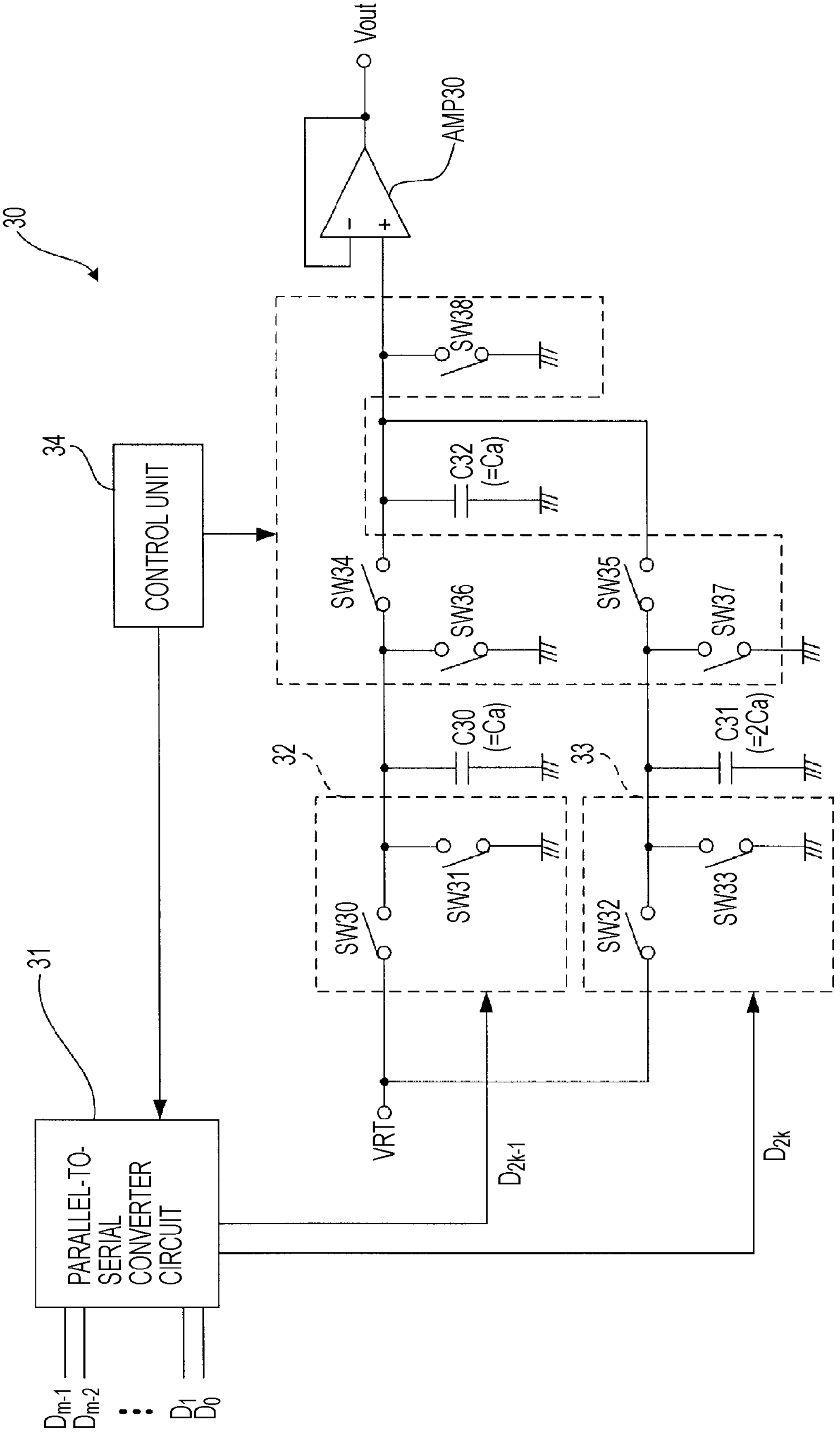
FIG. 3 is a block diagram of a D/A converter circuit constituting the source driver circuit shown in FIG. 2.

The D/A converter circuit block 22 includes a plurality of D/A converter circuits that convert driving digital signal of the vertical lines into driving analog signals. The D/A converter circuits will be described in detail below with reference to the drawings. FIG. 3 illustrates the detailed structure of a D/A converter circuit according to this embodiment.

As shown in FIG. 3, a D/A converter circuit 30 includes a parallel-to-serial converter circuit 31, an odd-bit voltage generator 32, an even-bit voltage generator 33, switches SW34 to SW 38, first capacitors C30 and C31, a second capacitor C32, an amplifier AMP30, and a control unit 34.

The parallel-to-serial converter circuit 31 segments the parallel digital data of m bits (m≧2) input to the D/A converter circuit 30 into two-bit units and converts these units into serial data with an odd bit or serial data with an even bit. For example, when the input digital signal is 4-bit parallel digital data corresponding to "1010" ($D_3$, $D_2$, $D_1$, $D_0$), the odd-bit serial data output from the parallel-to-serial converter circuit 31 is "00" ($D_2$, $D_0$) and the even-bit serial data is "11" ($D_3$, $D_1$). When the input digital signal is 4-bit parallel digital data corresponding to "1001" ($D_3$, $D_2$, $D_1$, $D_0$), the odd-bit serial data output from the parallel-to-serial converter circuit 31 is "01" ($D_2$, $D_0$) and the even-bit serial data is "10" ($D_3$, $D_1$).

The odd-bit voltage generator 32 includes switches SW30 and SW31 and outputs voltages corresponding to the odd-bit serial data $D_{2k-1}$ (1≦k≦m/2) output from the parallel-to-serial converter circuit 31 in sequence. For example, when the serial data $D_{2k-1}$ is "1," the switch SW30 is short-circuited to output a first voltage VRT, whereas when the serial data $D_{2k-1}$ is "0," the switch SW31 is short-circuited to output a second voltage (zero volts).

The even-bit voltage generator 33 includes switches SW32 and SW33 and outputs voltages corresponding to the even-bit serial data $D_{2k}$ (1≦k≦m/2) output from the parallel-to-serial converter circuit 31 in sequence. For example, when the serial data $D_{2k}$ is "1," the switch SW32 is short-circuited to output a first voltage VRT, whereas when the serial data $D_{2k}$ is "0," the switch SW33 is short-circuited to output a second voltage (zero volts).

The first capacitor C30 is connected to the output of the odd-bit voltage generator 32 and stores the voltage output from the odd-bit voltage generator 32. The first capacitor C30 is a first capacitor corresponding to the odd-bit serial data $D_{2k-1}$. The capacitance of the first capacitor C30 for odd bits is Ca(F).

The first capacitor C31 is connected to the even-bit voltage generator 33 and stores the voltage output from the even-bit voltage generator 33. The first capacitor C31 is a first capacitor corresponding to the even-bit serial data $D_{2k}$. The capacitance of the first capacitor C31 for even bits is twice of that of the add-bit first capacitor C30 and is 2Ca(F).

The second capacitor C32 is connected in parallel with the odd-bit first capacitor C30 by short-circuiting the switch SW34 and is connected in parallel with the even-bit first capacitor C31 by short-circuiting the switch SW35. The capacitance of the second capacitor C32 is the same as that of the odd-bit first capacitor C30 and is Ca(F).

One end of the switch SW34 is connected to the odd-bit first capacitor C30 and the other end is connected to the second capacitor C32. One end of the switch SW35 is connected to the even-bit first capacitor C31 and the other end is connected to the second capacitor C32. The switches SW34 and SW35 are short-circuited when the switches SW30 to SW33 of the odd-bit voltage generator 32 and the odd-bit voltage generator 32 are open. In other words, the short-circuiting is controlled by the switches SW30 to SW33 and the control unit 34. The voltage of the first capacitors C30 and C31 are set to voltages corresponding to the data output from the parallel-to-serial converter circuit 31 and, after the switches SW30 to SW33 are open, the switches SW34 and SW35 are short-circuited.

An inverting input terminal of the amplifier AMP30 is connected to an output terminal and a non-inverting input terminal is connected to the second capacitor C32 so as to constitute a voltage follower circuit. The voltage stored in the second capacitor C32 is output as an output voltage Vout.

The control unit 34 controls the parallel-to-serial converter circuit 31 so as to output a signal for controlling the odd-bit voltage generator 32 for each bit of odd-bit serial data from the parallel-to-serial converter circuit 31. Similarly, the control unit 34 controls the parallel-to-serial converter circuit 31 so as to output a signal for controlling the even-bit voltage generator 33 for each bit of even-bit serial data from the parallel-to-serial converter circuit 31.

The control unit 34 controls the switches SW34 and SW35 and connects in parallel the first capacitors C30 and C31 with the second capacitor C32 for a predetermined amount of time so as to adjust the voltage stored in the second capacitor C32.

The control unit 34 controls the switches SW36 to SW38 and short-circuits the first capacitors C30 and C31 with the second capacitor C32 for a predetermined amount of time so as to discharge the electric charge and set the voltage of the capacitors C30 to C32 to zero volts.

Figure 4:
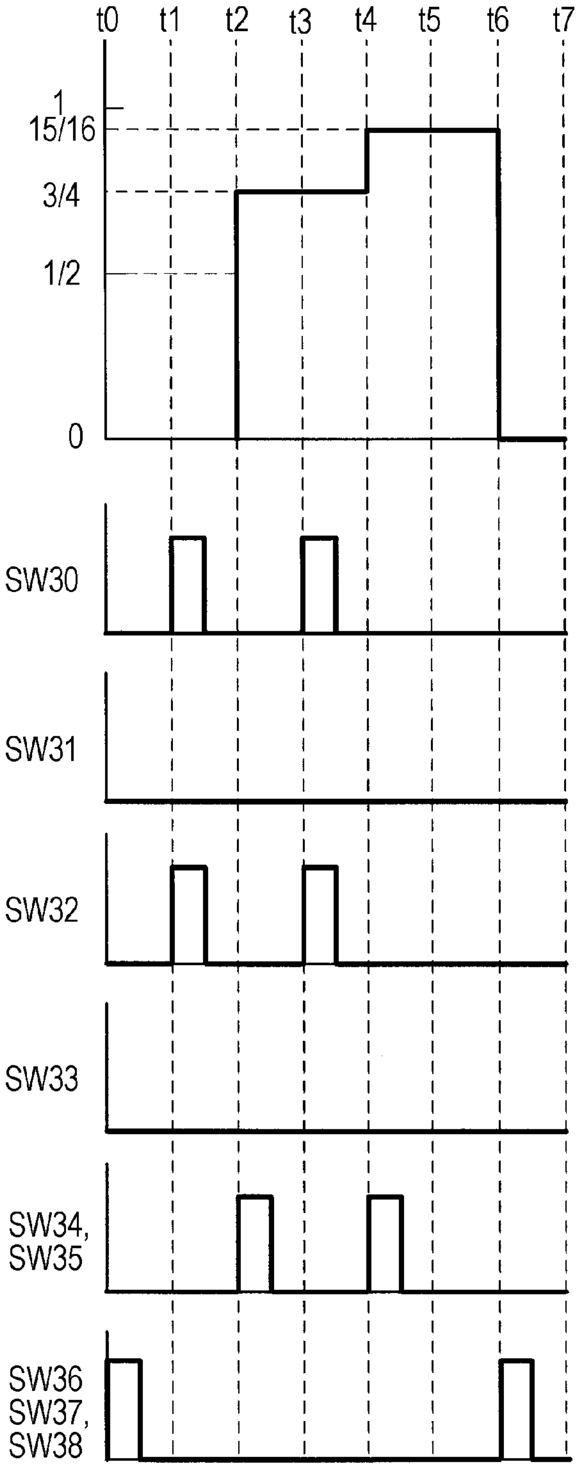
FIG. 4 illustrates the operation of the D/A converter circuit shown in FIG. 3.

With the D/A converter circuit 30 configured as described above, for example, when the digital data $D_{m-1}$, $D_{m-2}$, . . . $D_1$, $D_0$ input to the D/A converter circuit 30 corresponds to "1111," the switches SW30 to SW38 and the second capacitor C32 enter states shown in FIG. 4.

First, at a timing t0, the control unit 34 short-circuits the switches SW36 to SW38. In this way, the electric charge stored in the first capacitors C30 and C31 and the second capacitor C32 is discharged and the voltage of the capacitors C30 to C32 is set to zero volts.

Next, at a timing t1, the control unit 34 controls the parallel-to-serial converter circuit 31 and short-circuits the switch SW30 for a predetermined amount of time so as to apply a first voltage VRT, which is a voltage corresponding to the data "1" of the least significant bit $D_0$ (least significant odd bit) input to the parallel-to-serial converter circuit 31, to the first capacitor C30. In other words, the voltage of the first capacitor C30 is set to the first voltage VRT, and the amount of electric charge stored in the first capacitor C30 is set to Ca×VRT.

Furthermore, the control unit 34 controls the parallel-to-serial converter circuit 31 and short-circuits the switch SW32 for a predetermined amount of time so as to apply a first voltage VRT, which is a voltage corresponding to the data "1" of the second least significant bit $D_1$ (least significant even bit) input to the parallel-to-serial converter circuit 31, to the first capacitor C31. In other words, the voltage of the first capacitor C31 is set to the first voltage VRT, and the amount of electric charge stored in the first capacitor C31 is set to 2×Ca×VRT.

Then, at a timing t2, the control unit 34 short-circuits the switches SW34 and SW35 for a predetermined amount of time, connects in parallel the first capacitors C30 and C31 with the second capacitor C32, discharges part of the electric charge stored in the first capacitors C30 and C31 to the second capacitor C32, and sets the first capacitors C30 and C31 and the second capacitor C32 to equal voltage levels.

Here, the capacitance of the odd-bit first capacitor C30 and the second capacitor C32 is set to Ca, and the capacitance of the even-bit first capacitor C31 is set to 2Ca (twice of that of the odd-bit first capacitor C30).

Therefore, when the switches SW34 and SW35 are short-circuited, an electric charge of Ca×VRT×¼ is moved from the odd-bit first capacitor C30 to the second capacitor C32 and an electric charge of Ca×VRT×½ is moved from the even-bit first capacitor C31 to the second capacitor C32.

As a result, as represented by Expression 1 below, the voltages of the first capacitors C30 and C31 and the second capacitor C32 are set to VRT×¾.

$$Vout = \frac{C30 \times VRT + C31 \times VRT}{C30 + C31 + C32} = \frac{3Ca \times VRT}{4Ca} = \frac{3 \times VRT}{4} \quad (1)$$

Next, at a timing t3, the control unit 34 controls the parallel-to-serial converter circuit 31 and short-circuits the switch SW30 for a predetermined amount of time so as to apply a first voltage VRT, which is a voltage corresponding to the data "1" of the third least significant bit $D_2$ (most significant odd bit) input to the parallel-to-serial converter circuit 31, to the first capacitor C30. In other words, the voltage of the first capacitor C30 is set to the first voltage VRT, and the amount of electric charge stored in the first capacitor C30 is set to Ca×VRT.

Furthermore, the control unit 34 controls the parallel-to-serial converter circuit 31 and short-circuits the switch SW32 for a predetermined amount of time so as to apply a first voltage VRT, which is a voltage corresponding to the data "1" of the most significant bit $D_3$ (most significant even bit) input to the parallel-to-serial converter circuit 31, to the first capacitor C31. In other words, the voltage of the first capacitor C31 is set to the first voltage VRT, and the amount of electric charge stored in the first capacitor C31 is set to 2×Ca×VRT.

Then, at a timing t4, the control unit 34 short-circuits the switches SW34 and SW35 for a predetermined amount of time, connects in parallel the first capacitors C30 and C31 with the second capacitor C32, discharges part of the electric charge stored in the first capacitors C30 and C31 to the second capacitor C32, and sets the first capacitors C30 and C31 and the second capacitor C32 to equal voltage levels.

Here, as described above, the capacitance of the odd-bit first capacitor C30 and the second capacitor C32 is set to Ca, and the capacitance of the even-bit first capacitor C31 is set to 2Ca.

Therefore, when the switches SW34 and SW35 are short-circuited, an electric charge of Ca×VRT×1/16 is moved from the odd-bit first capacitor C30 to the second capacitor C32 and an electric charge of Ca×VRT×⅛ is moved from the even-bit first capacitor C31 to the second capacitor C32.

As a result, as represented by Expressions 2 below, the voltages of the first capacitors C30 and C31 and the second capacitor C32 are set to VRT×15/16 and is output from the amplifier AMP30 as an output voltage Vout.

$$\begin{aligned} Vout &= \frac{C30 \times VRT + C31 \times VRT + C32 \times \frac{3}{4}VRT}{C30 + C31 + C32} \\ &= \frac{Ca \times VRT + 2 \times Ca \times VRT + Ca \times \frac{3}{4}VRT}{4 \times Ca} \\ &= \frac{15 \times VRT}{16} \end{aligned} \quad (2)$$

Figure 5:
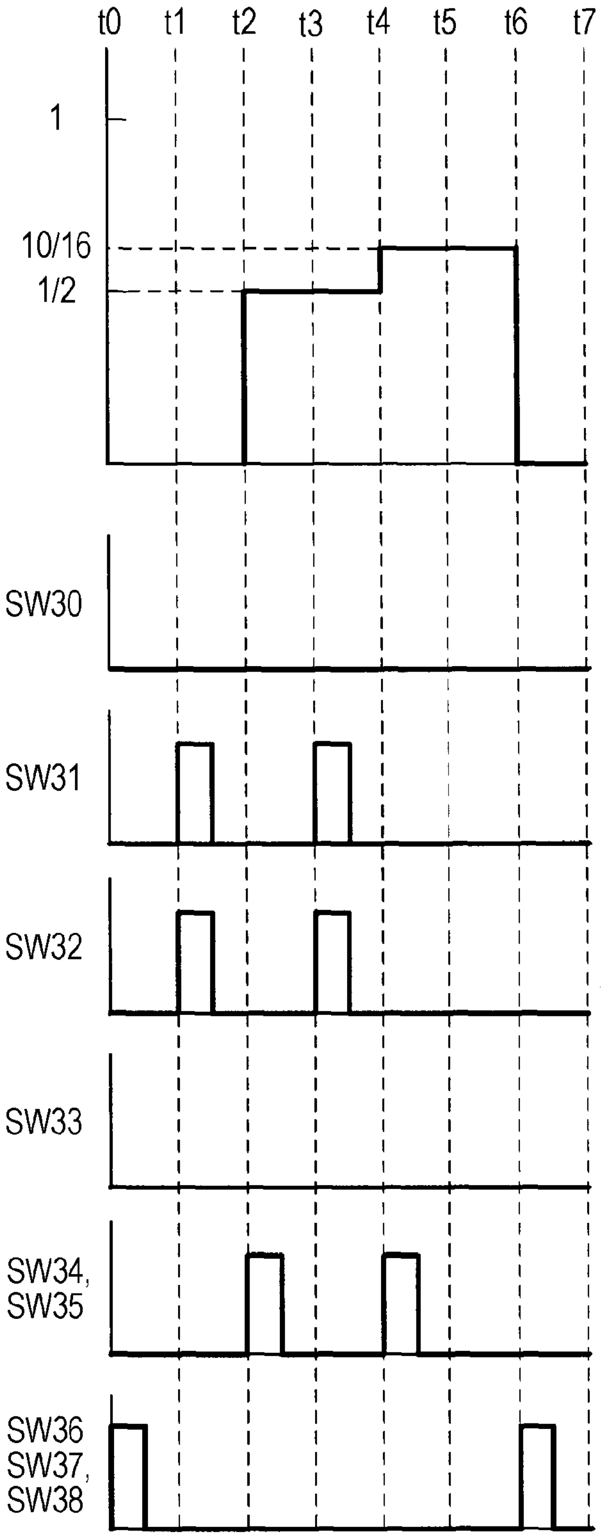
FIG. 5 illustrates the operation of the D/A converter circuit shown in FIG. 3.

Similarly, when "1010" is input as a digital signal, as shown in FIG. 5, at a timing t0, the control unit 34 short-circuits the switches SW36 to SW38, and the electric charge stored in the first capacitors C30 and C31 and the second capacitor C32 is discharged. At a timing t1, the control unit 34 short-circuits the switches SW31 and SW32 for a predetermined amount of time; the voltage of the first capacitor C30 is maintained at zero volts; and the voltage of the second capacitor C32 is set to VRT. At a timing t2, the control unit 34 short-circuits the switches SW34 and SW35 for a predetermined amount of time; the first capacitors C30 and C31 are connected in parallel to the second capacitor C32; and the voltage of the second capacitor C32 is set to ½VRT. The calculation is represented by Expression 3.

$$Vout = \frac{C30 \times O + C31 \times VRT}{C30 + C31 + C32} = \frac{2Ca \times VRT}{4Ca} = \frac{2 \times VRT}{4} \quad (3)$$

Furthermore, at a timing t3, the control unit 34 short-circuits the switches SW31 and SW32, maintains the voltage of the first capacitor C30 at zero volts, and sets the voltage of the first capacitor C31 to VRT. At a timing t4, the control unit 34 short-circuits the switches SW34 and SW35; the first capacitors C30 and C31 are connected in parallel to the second capacitor C32; and the voltage of the second capacitor C32 is set to 10/16×VRT and is output as an output voltage Vout. The calculation is represented by Expressions 4.

$$Vout = \frac{C30 \times 0 + C31 \times VRT + C32 \times \frac{2}{4}VRT}{C30 + C31 + C32} = \frac{Ca \times 0 + 2 \times Ca \times VRT + Ca \times \frac{2}{4}VRT}{4 \times Ca} = \frac{10 \times VRT}{16} \quad (4)$$

Figure 6:
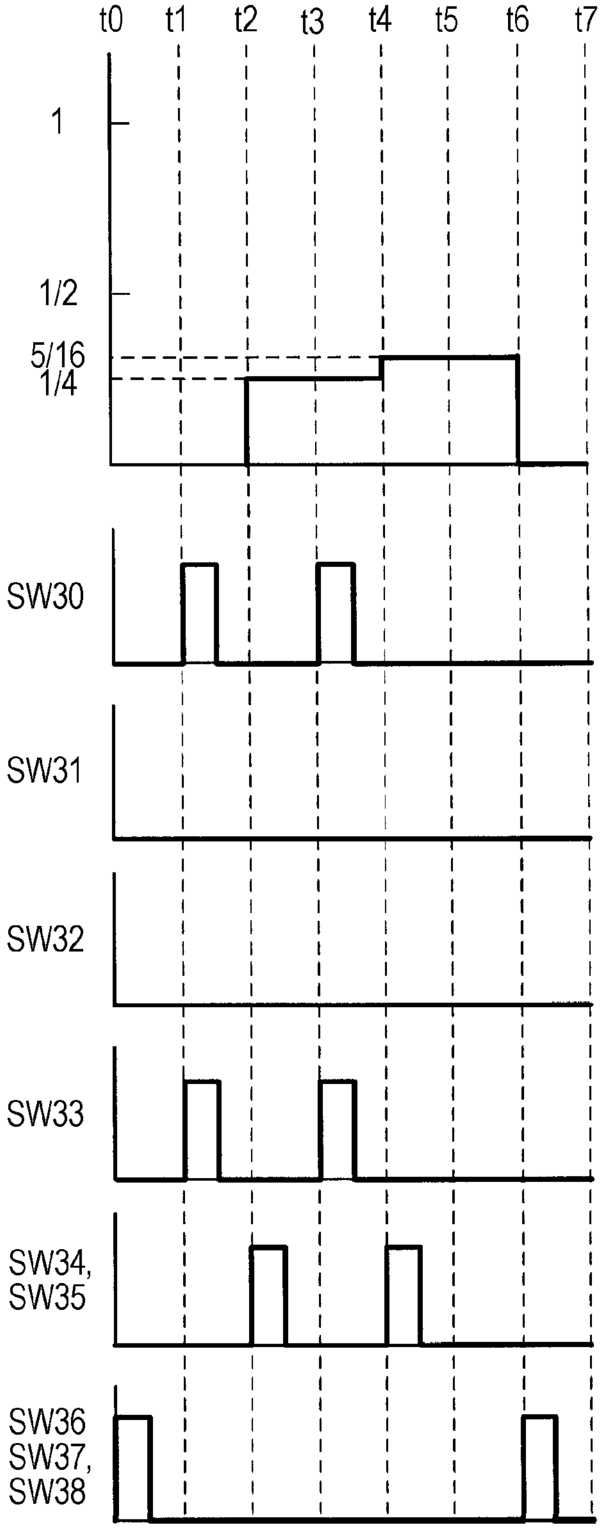
FIG. 6 illustrates the operation of the D/A converter circuit shown in FIG. 3.

Similarly, when "0101" is input as a digital signal, as shown in FIG. 6, at a timing t0, the control unit 34 short-circuits the switches SW36 to SW38, and the electric charge stored in the first capacitors C30 and C31 and the second capacitor C32 is discharged. At a timing t1, the control unit 34 short-circuits the switches SW30 and SW33 for a predetermined amount of time; the voltage of the first capacitor C30 is set to VRT; and the voltage of the first capacitor C31 is maintained at zero volts. At a timing t2, the control unit 34 short-circuits the switches SW34 and SW35 for a predetermined amount of time; the first capacitors C30 and C31 are connected in parallel to the second capacitor C32; and the voltage of the second capacitor C32 is set to ¼×VRT. The calculation is represented by Expression 5.

$$Vout = \frac{C30 \times VRT + C31 \times 0}{C30 + C31 + C32} = \frac{Ca \times VRT}{4Ca} = \frac{1 \times VRT}{4} \quad (5)$$

Furthermore, at a timing t3, the control unit 34 short-circuits the switches SW30 and SW33, sets the voltage of the first capacitor C30 to VRT, and maintains the voltage of the first capacitor C31 at zero volts. At a timing t4, the control unit 34 short-circuits the switches SW34 and SW35; the first capacitors C30 and C31 are connected in parallel to the second capacitor C32; and the voltage of the second capacitor C32 is set to 5/16×VRT and is output as an output voltage Vout. The calculation is represented by Expressions 6.

$$Vout = \frac{C30 \times VRT + C31 \times 0 + C32 \times \frac{1}{4}VRT}{C30 + C31 + C32} = \frac{Ca \times VRT + 2 \times Ca \times 0 + Ca \times \frac{1}{4}VRT}{4 \times Ca} = \frac{5 \times VRT}{16} \quad (6)$$

Figure 7:
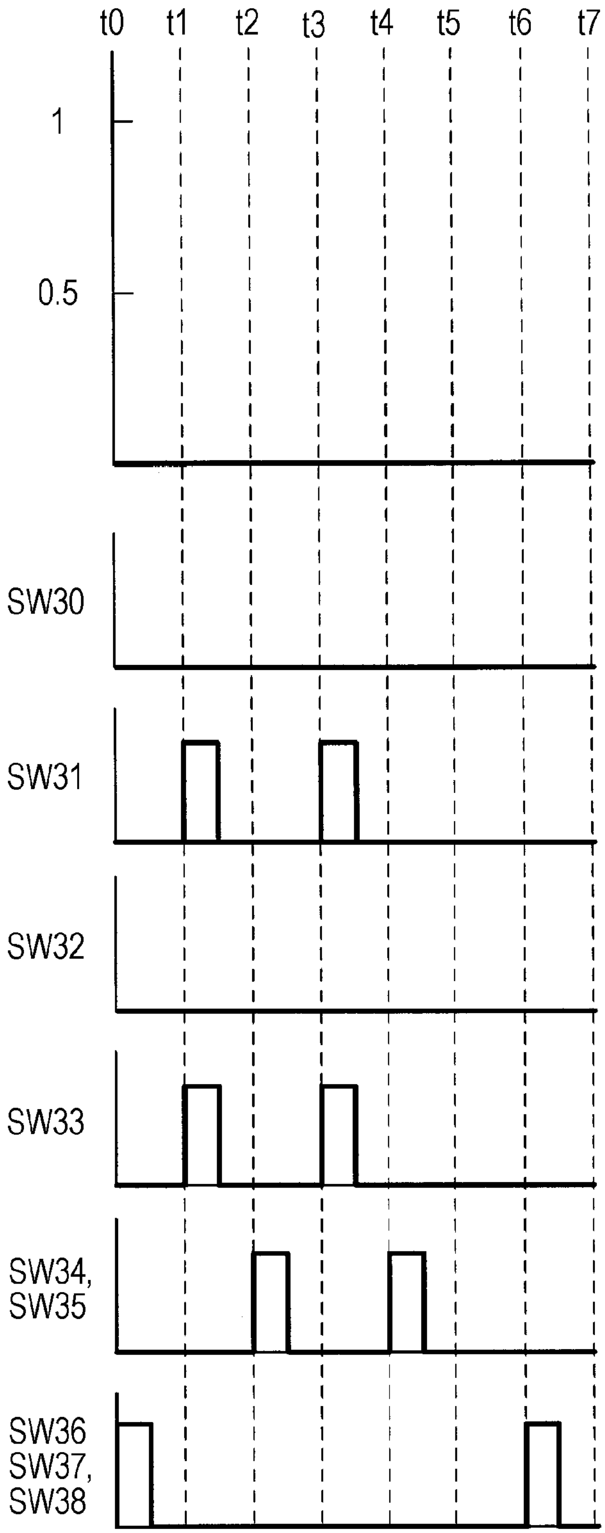
FIG. 7 illustrates the operation of the D/A converter circuit shown in FIG. 3.

Similarly, when "0000" is input as a digital signal, as shown in FIG. 7, at a timing t0, the control unit 34 short-circuits the switches SW36 to SW38, and the electric charge stored in the first capacitors C30 and C31 and the second capacitor C32 is discharged. At a timing t1, the control unit 34 short-circuits the switches SW31 and SW33 for a predetermined amount of time, and the voltages of the first capacitors C30 and C31 are maintained at zero volts. At a timing t2, the control unit 34 short-circuits the switches SW34 and SW35 for a predetermined amount of time, and the first capacitors C30 and C31 are connected in parallel to the second capacitor C32. However, since the first capacitors C30 and C31 are not charged, the voltage of the second capacitor C32 is maintained at zero volts. The calculation is represented by Expression 7.

$$Vout = \frac{C30 \times 0 + C31 \times 0}{C30 + C31 + C32} = \frac{Ca \times 0}{4Ca} = 0 \quad (7)$$

Furthermore, at a timing t3, the control unit 34 short-circuits the switches SW31 and SW33, and maintains the voltages of the first capacitors C30 and C31 at zero volts. At a timing t4, the control unit 34 short-circuits the switches SW34 and SW35, and the first capacitors C30 and C31 are connected in parallel to the second capacitor C32. However, since the first capacitors C30 and C31 are not charged, the voltage of the second capacitor C32 is maintained at zero volts, and this voltage is output as an output voltage Vout. The calculation is represented by Expressions 8.

$$Vout = \frac{C30 \times 0 + C31 \times 0 + C32 \times 0}{C30 + C31 + C32} = \frac{Ca \times 0 + 2 \times Ca \times 0 + Ca \times 0}{4 \times Ca} = 0 \quad (8)$$

In this way, since data is processed by two sets each, the speed of the D/A converting process is doubled compared with that of a known serial D/A converter circuit.

By constituting the first capacitor C31 by connecting in parallel two capacitors having a capacitance of Ca, the capacitance of all capacitors is set to Ca. Therefore, even when the capacitance varies during the production process, the variation in each capacitor will be the same. Thus, by providing a highly accurate capacity having a capacitance of Ca, digital-to-analog conversion can be easily carried out by the D/A converter circuit 30 in a highly accurate manner.

Furthermore, compared with a resistive ladder type D/A converter circuit in which the numbers of resistors and switches increases doubles as the number of bits increase, the number of resistors and switches of the D/A converter circuit according to this embodiment increases at a rate smaller than the increase rate of the number of bits. Therefore, the mounting area of the D/A converter circuit can be kept small.

According to this embodiment, an input digital signal is segmented into 2-bit units and two first capacitors are provided. However, the present invention is not limited thereto, and, for example, an input digital signal may be segmented into 3-bit units and three first capacitors may be provided, or an input digital signal may be segmented in 4-bit units and four first capacitors may be provided.

Figure 8:
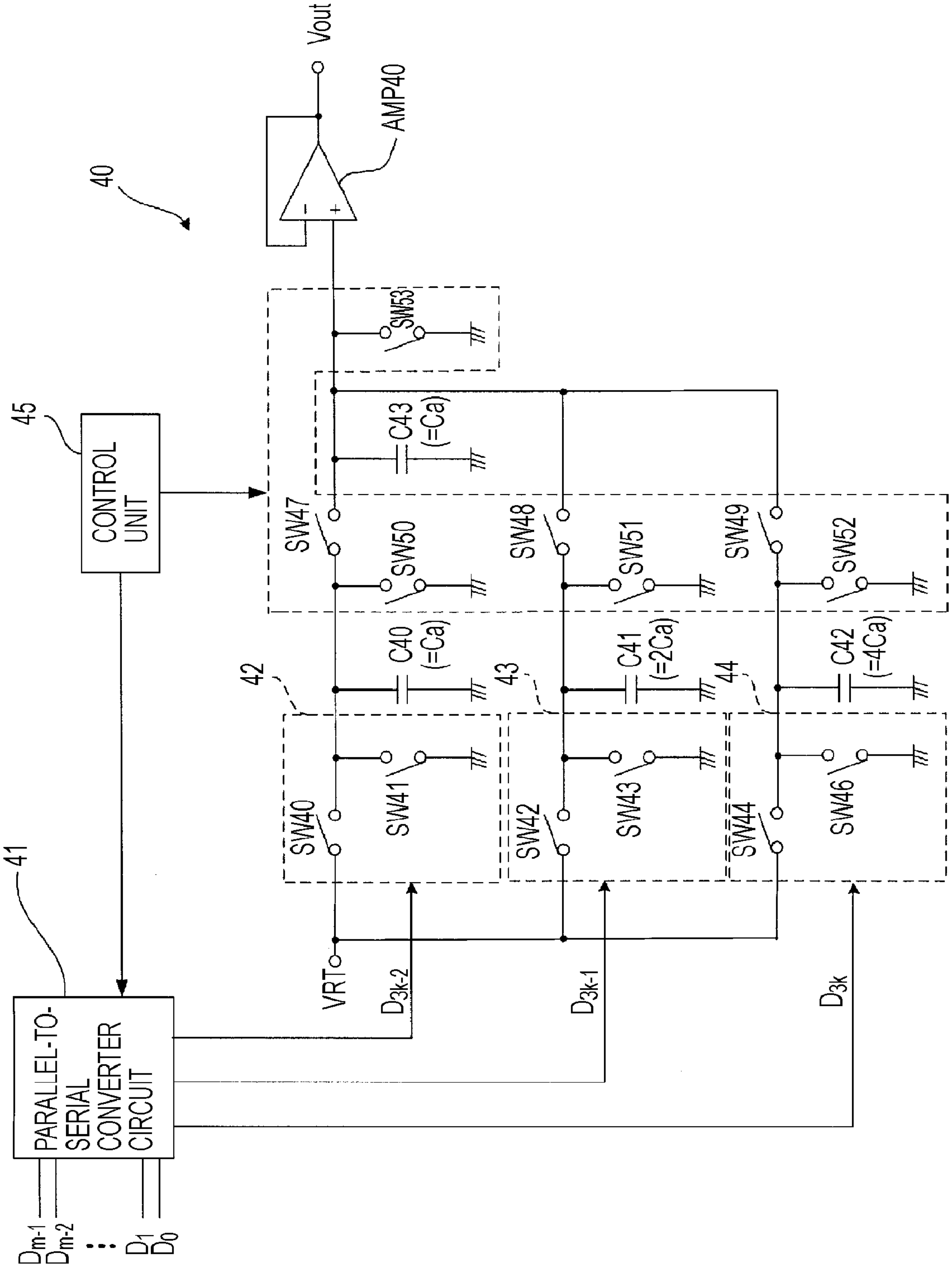
FIG. 8 is a circuit block diagram illustrating a D/A converter circuit according to another embodiment of the present invention.

FIG. 8 illustrates a D/A converter circuit 40 that segments an input digital signal into three-bit segments and includes three first capacitors.

The D/A converter circuit 40, shown in FIG. 8, includes a parallel-to-serial converter circuit 41 that generates a control signal for segmenting m-bit (m≧3) parallel digital data input to the D/A converter circuit 40 into 3-bit units and converting each unit of the 3-bit digital signal into a first voltage VRT or a second voltage (here which is zero volts).

The D/A converter circuit 40 includes a first-bit voltage generator 42 that outputs a voltage corresponding to a first bit $D_{3k-2}$, which is a segmented 3-bit unit, a second-bit voltage generator 43 that outputs a voltage corresponding to a first bit $D_{3k-1}$, a third-bit voltage generator 44 that outputs a voltage corresponding to a first bit $D_{3k}$, a first capacitor C40 for the first bit that stores a voltage output from the first-bit voltage generator 42, a second capacitor C41 for the second bit that stores a voltage output from the second-bit voltage generator 43, a third capacitor C42 for the third bit that stores a voltage output from the third-bit voltage generator 44, a second capacitor C43, switches SW47 to SW49 that connect in parallel the first capacitors C40 to C42 with the second capacitor C43, resetting switches SW50 to SW53 that discharge the electric charge stored in the first capacitors C40 to C42 and the second capacitor C43, an amplifier AMP40 for output, a control unit 45 that controls the switches SW47 to SW53. Here, k represents an integer value obtained by rounding up the numbers after the decimal point after dividing m by 3. For example, for eight bits, k=3, and for 10 bits, k=4.

The control unit 45 applies a voltage corresponding to the less significant 3-bit data input to the D/A converter circuit 40 to the first capacitors C40 to C42 and then, by connecting in parallel the first capacitors C40 to C42 with the second capacitor C43 for a predetermined amount of time, adjusts the voltage of the second capacitor C43 so that an output voltage Vout(1), which is represented by Expression 9 provided below, is output from the amplifier AMP40. The capacitance of the first capacitor C40 is Ca, the capacitance of the second capacitor C41 is 2×Ca, and the capacitance of the third capacitor C42 is 4×Ca.

$$Vout(1) = \frac{C40 \times V(D_{3k-2}) + 41 \times V(D_{3k-1}) + C42 \times V(D_{3k})}{C40 + C41 + C42 + C43} \quad (9)$$

In Expression 9 presented above, $V(D_{3k-2})$ represents a voltage corresponding to the first bit data, $V(D_{3k-1})$ represents a voltage of the second bit data, and $V(D_{3k})$ represents a voltage of the third bit data.

An output voltage Vout(p) obtained when voltage adjustment of the second capacitor C43 is repeated p times by controlling the switches SW47 to SW49 as described above is represented by Expressions 10 below.

$$Vout(p) = \frac{C40 \times V(D_{3k-2}) + 41 \times V(D_{3k-1}) + C42 \times V(D_{3k}) + C43 \times Vout(p-1)}{C40 + C41 + C42 + C43} \quad (10)$$

Figure 9:
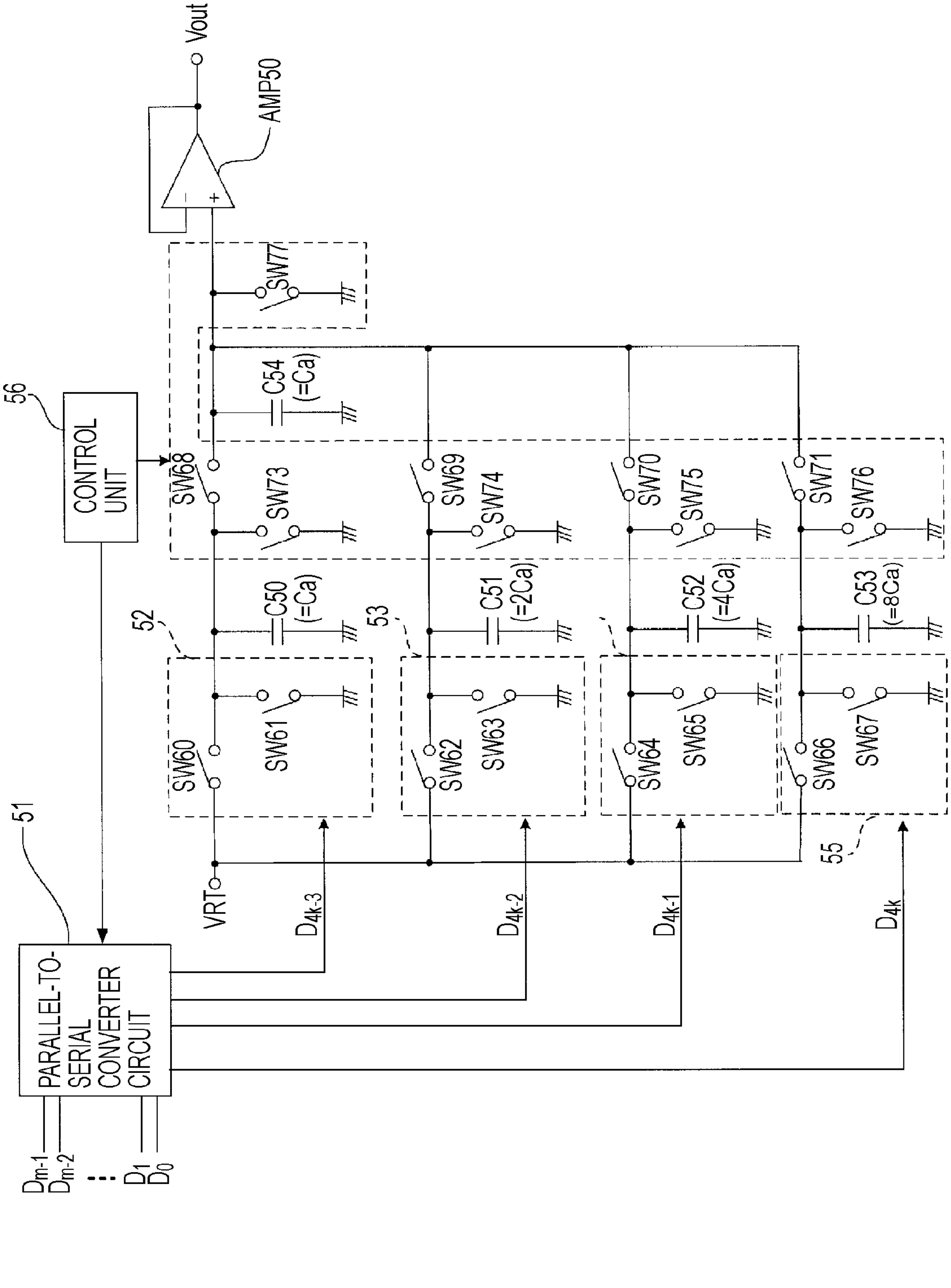
FIG. 9 is a circuit block diagram illustrating a D/A converter circuit according to another embodiment of the present invention.
Figure 10:
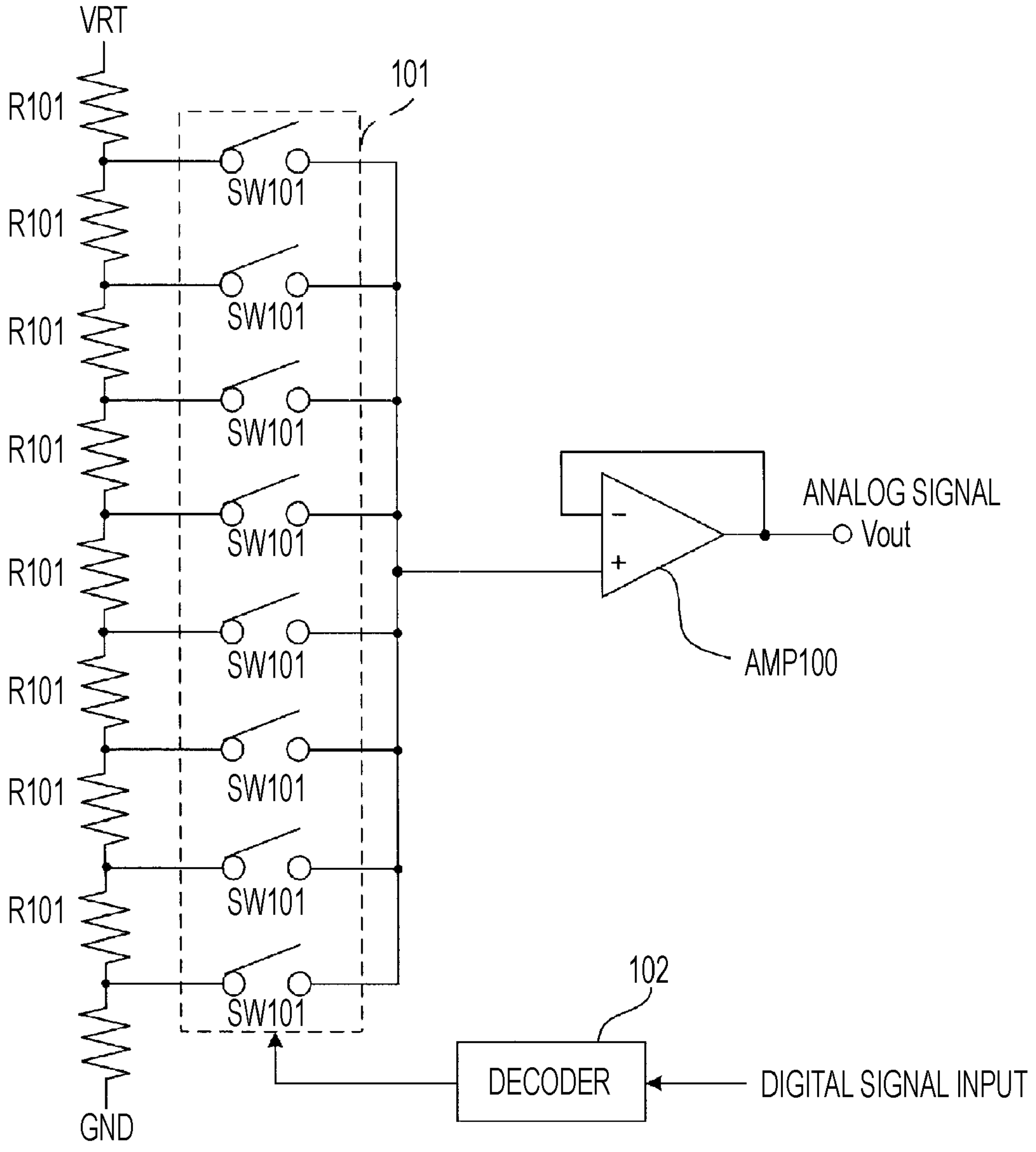
FIG. 10 is a circuit block diagram of a known resister ladder type D/A converter circuit.
Figure 11:
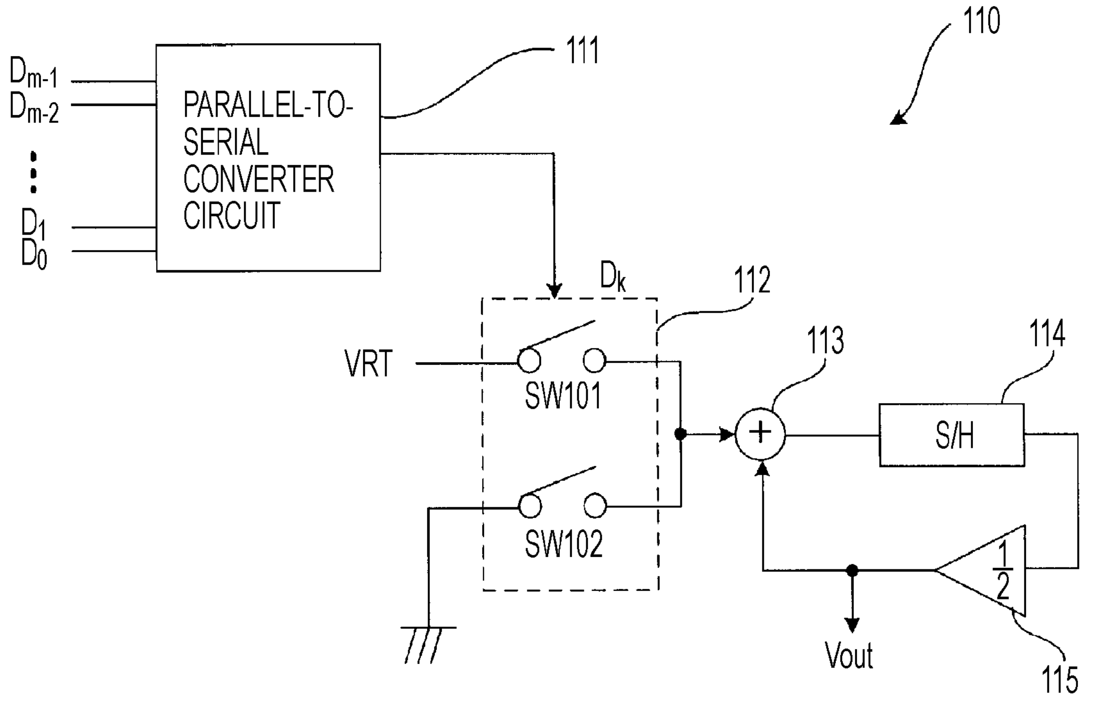
Related Art FIG. 11
FIG. 11 illustrates the principle of a known cyclic D/A converter circuit.
Figure 12:
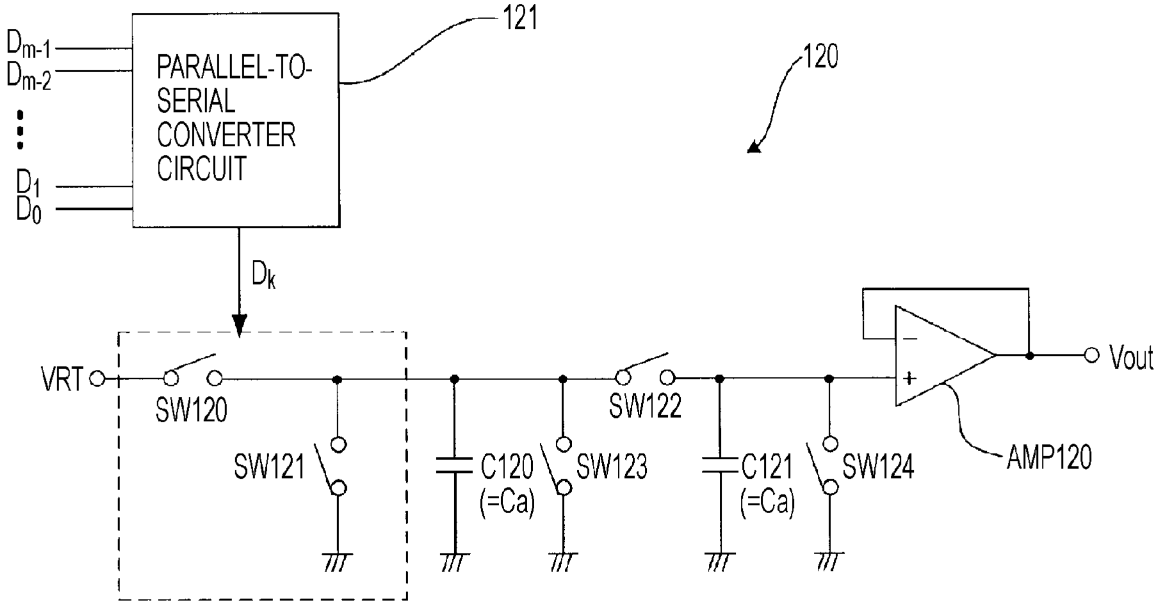
FIG. 12 Related Art
FIG. 12 is a circuit block diagram of a known cyclic D/A converter circuit.

Furthermore, FIG. 9 illustrates a D/A converter circuit 50 that segments an input digital signal into 4-bit units and includes four first capacitors.

The D/A converter circuit 50 illustrated in FIG. 9 includes a parallel-to-serial converter circuit 51 that segments parallel digital data of m bits (m≧4) input to the D/A converter circuit 50 into 4-bit units and generates a control signal for converting each 4-bit digital signal into a first voltage VRT or a second voltage (here, which is zero volts).

The D/A converter circuit 50 includes a first-bit voltage generator 52 that outputs a voltage corresponding to the data of a first bit $D_{4k-3}$, which is one of the 4-bit units, a second-bit voltage generator 53 that outputs a voltage corresponding to the data of a second bit $D_{4k-k2}$, a third-bit voltage generator 54 that outputs a voltage corresponding to the data of a third bit $D_{4k-1}$, a third-bit voltage generator 55 that outputs a voltage corresponding to the data of a fourth bit $D_{4k}$, a first-bit first capacitor C50 that stores the voltage output from the first-bit voltage generator 52, a second-bit first capacitor C51 that stores the voltage output from the second-bit voltage generator 53, a third-bit first capacitor C52 that stores the voltage output from the third-bit voltage generator 54, a fourth-bit first capacitor C53 that stores the voltage output from the fourth-bit voltage generator 55, a second capacitor C54, switches SW68 to SW71 that connect in parallel the first capacitors C50 to C53 with the second capacitor C54, reset switches SW72 to SW77 for discharging the electric charge stored in the first capacitors C50 to C53 and the second capacitor C54, an amplifier AMP50 for output, and a control unit 56 that controls the parallel-to-serial converter circuit 51 and the switches SW68 to SW77. Here, k represents an integer value obtained by rounding up the numbers after the decimal point after dividing m by 4. For example, for eight bits, k=2, and for 10 bits, k=3.

The control unit 56 applies a voltage corresponding to the data of the least four bits of the digital signal input to the D/A converter circuit 50 to the first capacitors C50 to C53. Then, by connecting in parallel the first capacitors C50 to C53 with the second capacitor C54 for a predetermined amount of time, the control unit 56 adjusts the voltage of the second capacitor C54 so as to output an output voltage Vout(1), which is represented by Expression 11 presented below, from the amplifier AMP50. The capacitance of the first capacitor C50 and the second capacitor C54 is Ca; the capacitance of the first capacitor C51 is 2×Ca; the capacitance of the first capacitor C52 is 4×Ca; and the capacitance of the first capacitor C53 is 8×Ca.

$$Vout(1) = \frac{C50 \times V(D_{4k-3}) + C51 \times V(D_{4k-2}) + C52 \times V(D_{4k-1}) + C53 \times V(D_{4k})}{C50 + C51 + C52 + C53 + C54} \quad (11)$$

With Expression 11, the voltage corresponding to the first-bit data is represented by $V(D_{4k-3})$, the voltage corresponding to the second-bit data is represented by $V(D_{4k-2})$, the voltage corresponding to the third-bit data is represented by $V(D_{4k-1})$, and the voltage corresponding to the fourth-bit data is represented by $V(D_{4k})$.

An output voltage Vout(p) obtained when voltage adjustment of the second capacitor C54 is repeated p times by controlling the switches SW68 to SW71 as described above is represented by Expressions 12 below.

$$Vout(p) = \frac{C50 \times V(D_{4k-3}) + C51 \times V(D_{4k-2}) + C52 \times V(D_{4k-1}) + C53 \times V(D_{4k}) + C54 \times Vout(D_{p-1})}{C50 + C51 + C52 + C53 + C54} \quad (12)$$

As described above, the liquid crystal device according to this embodiment includes a liquid crystal display panel and a liquid crystal driving circuit that outputs a driving signal for driving the pixels provided on the liquid crystal display panel. The liquid crystal driving circuit includes a plurality of D/A converter circuits that convert an m-bit digital signal into an analog signal, which is the driving signal.

The D/A converter circuits includes a data converting unit (which is equivalent to a parallel-to-serial converter circuit) that segments a digital signal into n-bit units (n≦m/2) from a least significant bit to a most significant bit, a bit voltage generator that converts each bit of the segmented n-bit units of the digital signal into a first voltage or a second voltage, an n number of first capacitors that each store the voltage for each bit output from the bit voltage generator, an n number of switches whose first ends are connected to the first capacitors, a second capacitor connected to second ends of the switches, an output unit that outputs the voltage stored in the second capacitor as an analog signal, and a control unit that controls the n number of switches, that connects in parallel the n number of first capacitors with the second capacitor, and that adjusts the voltage stored in the second capacitor. The D/A converter circuits set the capacitance of the first capacitor corresponding to the qth bit of each unit (where q is an integer equal to 1 or greater but not greater than n) to a value obtained by multiplying the capacitance of the first capacitor corresponding to the least significant bit with $2^{q-1}$.

By employing this configuration, a high gradation level D/A converter circuit that carries out digital-to-analog conversion at high speed while requiring a small mounting area and having low electric consumption and high accuracy.

The number of bits (the unit of the segments) simultaneously input is determined by taking into consideration the overall balance of the source driver circuit 11. In this way, a D/A converter circuit appropriate to the use condition can be provided.

It should be understood by those skilled in the art that various modifications, combinations, sub-combinations and alterations may occur depending on design requirements and other factors insofar as they are within the scope of the appended claims or the equivalents thereof.

What is claimed is:

1. A digital-to-analog converter circuit configured to convert an m-bit digital signal into an analog signal, the circuit comprising:

a circuit configured to segment the m-bit digital signal into n-bit (n≦m/2) units from a least significant bit to a most significant bit;

an n number of bit voltage generators, each bit voltage generator configured to convert a bit of the segmented n-bit units of the m-bit digital signal into a first voltage or a second voltage, wherein n>1, each bit voltage generator including a pair of switches which selectively apply the first and second voltages;

an n number of first capacitors respectively associated with the n-bit units, each capacitor configured to store a respective first voltage for a respective bit output from the respective bit voltage generator when one of the switches of the pair of switches is selectively applied, and configured to store a respective second voltage for a respective bit output from the respective bit voltage generator when the other switch of the pair of switches is selectively applied, each of the first capacitors having a first end electrically connected to the pair of switches of the respective bit voltage generator;

an n number of first switches whose first ends are respectively electrically connected to the n number of first capacitors;

an n number of second switches, each second switch having one end that is electrically connected to the first end of a respective first capacitor and the first end of a respective first switch, and having another end that is grounded;

a second capacitor electrically connected to second ends of the n number of first switches;

an output unit configured to output a voltage stored in the second capacitor as an analog signal; and a control unit configured to (a) control the n number of first switches, (b) control the n number of second switches, (c) connect in parallel the n number of first capacitors with the second capacitor, and (d) adjust the voltage stored in the second capacitor, wherein, a capacitance value of the first capacitor corresponding to a qth bit of each unit (where q is an integer equal to 1 or greater but not greater than n) is set to a value obtained by multiplying the capacitance of the first capacitor corresponding to the least significant bit with $2^{q-1}$.

2. A liquid crystal driving circuit configured to output a driving signal for driving pixels provided on a liquid crystal display panel, the liquid crystal driving circuit comprising:

a digital-to-analog converter circuit configured to convert an m-bit digital signal into an analog signal, wherein the digital-to-analog converter circuit includes a circuit configured to segment the m-bit digital signal into n-bit (n≦m/2) units from a least significant bit to a most significant bit, an n number of bit voltage generators, each bit voltage generator configured to convert a bit of the segmented n-bit units of the m-bit digital signal into a first voltage or a second voltage, wherein n>1, each bit voltage generator including a pair of switches which selectively apply the first and second voltages, an n number of first capacitors respectively associated with the n-bit units, each capacitor configured to store a respective first voltage for a respective bit output from the respective bit voltage generator when one of the switches of the pair of switches is selectively applied, and configured to store a respective second voltage for a respective bit output from the respective bit voltage generator when the other switch of the pair of switches is selectively applied, each of the first capacitors having a first end electrically connected to the pair of switches of the respective bit voltage generator, an n number of first switches whose first ends are respectively electrically connected the n number of first capacitors, an n number of second switches, each second switch having one end that is electrically connected to the first end of a respective first capacitor and the first end of a respective first switch, and having another end that is grounded;

a second capacitor electrically connected to second ends of the n number of first switches, an output unit configured to output the voltage stored in the second capacitor as an analog signal, and a control unit configured to (a) control the n number of first switches, (b) control the n number of second switches, (c) connect in parallel the n number of first capacitors with the second capacitor, and (d) adjust the voltage stored in the second capacitor, wherein, a capacitance value of the first capacitor corresponding to a qth bit of each unit (where q is an integer equal to 1 or greater but not greater than n) is set to a value obtained by multiplying the capacitance of the first capacitor corresponding to the least significant bit with $2^{q-1}$.

3. A liquid crystal device comprising:

a liquid crystal display panel; and a liquid crystal driving circuit configured to output a driving signal for driving pixels provided on a liquid crystal display panel, wherein, the liquid crystal driving circuit includes a plurality of digital-to-analog converter circuits, each of the digital-to-analog converter circuits being configured to convert an m-bit digital signal into an analog signal, and each of the digital-to-analog converter circuits includes:

a circuit configured to segment the m-bit digital signal into n-bit (n≦m/2) units from a least significant bit to a most significant bit, an n number of bit voltage generators, each bit voltage generator to convert a bit of the segmented n-bit units of the m-bit digital signal into a first voltage or a second voltage, wherein n>1, each bit voltage generator including a pair of switches which selectively apply the first and second voltages, an n number of first capacitors respectively associated with the n-bit units, each capacitor configured to store a respective first voltage for a respective bit output from the bit voltage generator when one of the switches of the pair of switches is selectively applied, and configured to store a respective second voltage for a respective bit output from the respective bit voltage generator when the other switch of the pair of switches is selectively applied, each of the first capacitors having a first end electrically connected to the pair of switches of the respective bit voltage generator, an n number of first switches whose first ends are respectively electrically connected to the n number of first capacitors, an n number of second switches, each second switch having one end that is electrically connected to the first end of a respective first capacitor and the first end of a respective first switch, and having another end that is grounded;

a second capacitor electrically connected to second ends of the n number of first switches, an output unit configured to output a voltage stored in the second capacitor as an analog signal, and a control unit configured to (a) control the n number of first switches, (b) control the n number of second switches, (c) connect in parallel the n number of first capacitors with the second capacitor, and (d) adjust the voltage stored in the second capacitor, wherein, a capacitance value of the first capacitor corresponding to a qth bit of each unit (where q is an integer equal to 1 or greater but not greater than n) is set to a value obtained by multiplying the capacitance of the first capacitor corresponding to the least significant bit with $2^{q-1}$.

* * * * *